United States Patent [19]

Yamada et al.

[11] Patent Number: 4,724,341

[45] Date of Patent: Feb. 9, 1988

[54] CMOS DECODER CIRCUIT RESISTANT TO LATCH-UP

[75] Inventors: Michihiro Yamada; Hiroshi Miyamoto, both of Hyogo, Japan

[73] Assignee: Mitsubishi Denki Kabushiki Kaisha, Tokyo, Japan

[21] Appl. No.: 941,214

[22] Filed: Dec. 12, 1986

[30] Foreign Application Priority Data

Dec. 18, 1985 [JP] Japan .................................. 60-285165

[51] Int. Cl.$^4$ .................. H03K 17/56; H03K 19/094; G06F 7/38
[52] U.S. Cl. .................................... 307/449; 307/469; 307/243
[58] Field of Search ............... 307/243, 449, 465, 468, 307/469, 551

[56] References Cited

U.S. PATENT DOCUMENTS 4,651,031  3/1987  Kamuro ............................. 307/449

OTHER PUBLICATIONS

IBM Tech. Disc. Bul., "Multiple Partitioned Programmable Logic Array", Greenspan.

Primary Examiner—John S. Heyman
Assistant Examiner—M. R. Wambach
Attorney, Agent, or Firm—Lowe, Price, LeBlanc, Becker & Shur

[57] ABSTRACT

A decoder part is formed by a main decoder part C and a plurality of subdecoder parts $D_0$ to $D_3$ connected with the main decoder part C, and a plurality of such decoder parts are provided. In such structure, the main decoder part specifies one of a plurality of decoder parts and a CMOS circuit (PMOS transistor $T_0$ and NMOS transistors $T_0'$, ..., PMOS transistor and NMOS transistor $T_3'$) specifies one of the subdecoder parts and PMOS transistors ($T_{00}$ to $T_{03}$, ..., $T_{30}$ to $T_{33}$) select finally decoded output.

3 Claims, 9 Drawing Figures

CMOS DECODER CIRCUIT RESISTANT TO LATCH-UP

BACKGROUND OF THE INVENTION

1. Field of the Invention

The present invention relates to a decoder circuit, and more particularly, it relates to a decoder circuit which is formed by CMOS transistors.

2. Description of the Prior Art

Since the present invention is most applicable to a MOS dynamic RAM formed by CMOS transistors, description is now made with reference to such a MOS dynamic RAM.

With increase in storage capacity of a MOS dynamic RAM, CMOS circuits have been widely employed in view of high-speedness and low power consumption. However, the CMOS circuits have the latch-up problem, whereby N-channel MOS transistor (hereinafter referred to as NMOS transistor) and P-channel MOS transistor (hereinafter referred to as PMOS transistor) cannot be easily provided adjacent to each other for the pattern layout purpose.

In general, a MOS dynamic RAM is necessarily provided with a decoder circuit for selecting a prescribed memory cell from a memory cell array. The following description is made with reference to a 1-of-64 decoder circuit for selecting a single row (or column) from 64 ($2^6=64$) rows (or columns) through 6-bit address signals $A_0$ to $A_5$.

FIG. 1 is a logic circuit diagram showing an example of a conventional 1-of-64 decoder circuit. Referring to FIG. 1, a 6-input NAND circuit $1_0$ is supplied with address signals $A_0$, $A_1$, $A_2$, $A_3$, $A_4$ and $A_5$. An inverter $2_0$ is adapted to invert the output from the NAND circuit $1_0$, and generates decoded output $Y_0$. A decoder part $3_0$ is thus formed by the NAND circuit $1_0$ and the inverter $2_0$. Another decoder part $3_1$ is similarly formed by a NAND circuit $1_1$ and an inverter $2_1$. The NAND circuit $1_1$ receives address signals $\overline{A_0}$ (inverted $A_0$), $A_1$, $A_2$, $A_3$, $A_4$ and $A_5$. Subsequent decoder parts are respectively formed to receive the address signals $A_0$, $A_1$, $A_2$, $A_3$, $A_4$ and $A_5$ and inverted signals $\overline{A_0}$, $\overline{A_1}$, $\overline{A_2}$, $\overline{A_3}$, $\overline{A_4}$ and $\overline{A_5}$ thereof orderly in different combinations in the 6-input NAND circuits. The last decoder part $3_{63}$ is formed by a 6-input NAND circuit $1_{63}$ supplied with the address signals $\overline{A_0}$, $\overline{A_1}$, $\overline{A_2}$, $\overline{A_3}$, $\overline{A_4}$ and $\overline{A_5}$ and an inverter $2_{63}$.

In the circuit as shown in FIG. 1, the output $Y_0$ goes high only when all of the address signals inputted in the 6-input NAND circuit $1_0$ are at "H" levels, to be in a selected state. When, to the contrary, at least one of the address signals inputted in the 6-input NAND circuit $1_0$ is at an "L" level, the output $Y_0$ goes low to be in an unselected state. Therefore, with respect to $2^6=64$ combinations of the address signals $A_0$ to $A_5$, only one of the decoder parts can be selected while keeping the remaining 63 decoder parts in unselected states. This is the basic operation of the decoder circuit.

FIG. 2 is a circuit diagram showing the decoder part $3_0$ as shown in FIG. 1, which is simply formed by a CMOS circuit. The 6-input NAND circuit $1_0$ is formed by six PMOS transistors connected in the parallel form and six NMOS transistors connected in the series form. The inverter $2_0$ is formed by a PMOS transistor serving as a loading transistor and an NMOS transistor serving as a driver transistor. These transistors are formed by well-known methods, and hence detailed description thereof is omitted.

The pitch of a decoder circuit employed for a MOS dynamic RAM is determined by that of word lines forming the memory cell array. Such pitch of the word lines has been reduced with increase in the storage capacity of the MOS dynamic RAM. In case of a 1-Mbit MOS dynamic RAM, for example, the pitch of word lines is about 4 $\mu$m. When the 1-of-64 decoder circuit as shown in FIG. 1 is formed by the CMOS circuits as shown in FIG. 2, the respective decoder parts $3_0$ to $3_{63}$ as shown in FIG. 1 must be subjected to pattern layout in the pitch of 4 $\mu$m. Consequently, the NMOS transistors and the PMOS transistors forming the 6-input NAND circuits $1_0$ to $1_{63}$ must be subjected to pattern layout in an adjacent manner, and such adjacent pattern layout easily causes a latch-up phenomenon. Thus, it is extremely important to enlarge the pitch between adjacent decoder parts, in order to prevent the latch-up phenomenon.

FIG. 3 illustrates another example of a conventional 1-of-64 decoder circuit employed for enlarging the pitch of the decoder circuit formed by CMOS circuits. Referring to FIG. 3, each decoder part is formed by a main decoder part A and four subdecoder parts $B_0$ to $B_3$. The main decoder part A is formed by a 4-input NAND circuit 4, which receives address signals $A_0$, $A_1$, $A_2$ and $A_3$. The subdecoder part $B_0$ is formed by a PMOS transistor $T_0$ and an NMOS transistor $T_0'$. The PMOS transistor $T_0$ has a drain supplied with a predecoded signal $P_0$, a source connected with an output end deriving output $Y_0$ and a gate connected to an output node N1 of the 4-input NAND circuit 4. The NMOS transistor $T_0'$ has a drain connected to the output end deriving the output $Y_0$, a grounded source and a gate connected to the node N1. In a similar manner of connection, the subdecoder part $B_1$ is formed in correspondence to a predecoded signal $P_1$ and the subdecoder part $B_2$ is formed in correspondence to a predecoded signal $P_2$, while the subdecoder part $B_3$ is formed in correspondence to a predecoded signal $P_3$. 16 such decoder parts as shown in FIG. 3 are provided to obtain 64 decoded outputs $Y_0$ to $Y_{63}$. The main decoder parts A of the 16 decoder parts are supplied with address signals in different combinations.

FIG. 4 shows a circuit for generating the four predecoded signals $P_0$ to $P_3$ used in the decoder circuit as shown in FIG. 3. As obvious from FIG. 4, this circuit is adapted to generate the predecoded signals $P_0$ to $P_3$ by decoding address signals $A_4$, $\overline{A_4}$, $A_5$ and $\overline{A_5}$ through 2-input NAND circuits $5_0$ to $5_3$ and inverters $6_0$ to $6_3$.

The decoder circuit as shown in FIG. 3 can perform pattern layout of the main decoder parts A in the pitch four times longer than that of the decoder circuit as shown in FIG. 1. With respect to the subdecoder parts, no pattern layout problem is caused since the transistors employed therefor are small in size and can be arranged in deviation along the horizontal direction of FIG. 3. In the circuit as shown in FIG. 3, therefore, the degree of adjacency of the NMOS transistors and the PMOS transistors can be relaxed. However, when the circuit as shown in FIG. 3 is applied to a 1-Mbit MOS dynamic RAM, each decoder part must be subjected to pattern layout in the pitch of 16 $\mu$m (4 $\mu$m $\times$ 4), which value is not sufficient in view of the latch-up problem. Further, the decoder circuit as shown in FIG. 3 cannot cope with a mass storage memory having storage capacity exceeding 4 Mbits.

FIG. 5 shows still another example of a conventional decoder circuit proposed for enlarging the pitch of the decoder circuit. The circuit as shown in FIG. 5 is formed on the basis of the decoder circuit as shown in FIG. 3, to increase the number of predecoded signals from 4 to 16. Therefore, this circuit is substantially identical in basic operation to the circuit as shown in FIG. 3.

FIG. 6 shows a circuit for generating predecoded signals $P_0$ to $P_{15}$ used in the decoder circuit as shown in FIG. 5. The circuit as shown in FIG. 6 is adapted to generate the predecoded signals $P_0$ to $P_{15}$ by decoding address signals $A_2$, $\overline{A_2}$, $A_3$, $\overline{A_3}$, $A_4$, $\overline{A_4}$, $A_5$ and $\overline{A_5}$ by 4-input NAND circuits $8_0$ to $8_{15}$ and inverters $9_0$ to $9_{15}$.

The decoder circuit as shown in FIG. 5 can perform pattern layout of main decoder parts A in the pitch 16 times longer than that of the decoder circuit as shown in FIG. 1. When this circuit is applied to a 1-Mbit MOS dynamic RAM, therefore, the pitch thereof is 64 $\mu$m (4 $\mu$m $\times$ 16), which value is sufficiently allowable in view of the latch-up problem. However, increase in the area for wiring 16 predecoded signals and that of the circuit for generating the 16 predecoded signals are not negligible in view of pattern layout. Further, increase in stray capacitance by the gate capacitance of 16 NMOS transistors $T_0, T_1, \ldots, T_{15}$ and 16 PMOS transistors $T_0', T_1', \ldots, T_{15}'$ connected to an output node N1 of each main decoder part A hinders high-speed operation of the decoder circuit.

In the conventional decoder circuit as hereinabove described, enlargement of the pattern layout pitch for each decoder part leads to increase in number of predecoded signals with increase in the circuit area, while the operating speed of the circuit cannot be increased by increase in stray capacitance.

SUMMARY OF THE INVENTION

An object of the present invention is to provide a decoder circuit which can enlarge the pitch of the decoder circuit while reducing the number of predecoded signals.

Briefly stated, the decoder circuit according to the present invention comprises a plurality of decoder parts each having a main decoder part for decoding a first bit group of a plurality of bits of input signals and a plurality of subdecoder parts connected with the main decoder part, first predecoding means for generating first predecoded signals by decoding a second bit group of the input signals and second predecoding means for generating second predecoded signals by decoding a third bit group of the input signals. Further, each subdecoder part includes a CMOS circuit driven by the output of the main decoder part and selectively activated by the first predecoded signals and a plurality of switching elements commonly receiving the output from the CMOS circuit and being selectively switched by the second predecoded signals.

In the aforementioned structure of the present invention, the main decoder part specifies one of a plurality of decoder parts and the CMOS circuit specifies one of a plurality of subdecoder parts, while the second predecoded signals turn one of the switching elements on to derive decoded output.

According to the present invention, the pitch of the decoder circuit can be enlarged while keeping predecoded signals in a small number. Thus, a decoder circuit resistant against a latch-up phenomenon can be obtained with no sacrifice of the operating speed thereof.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 7:
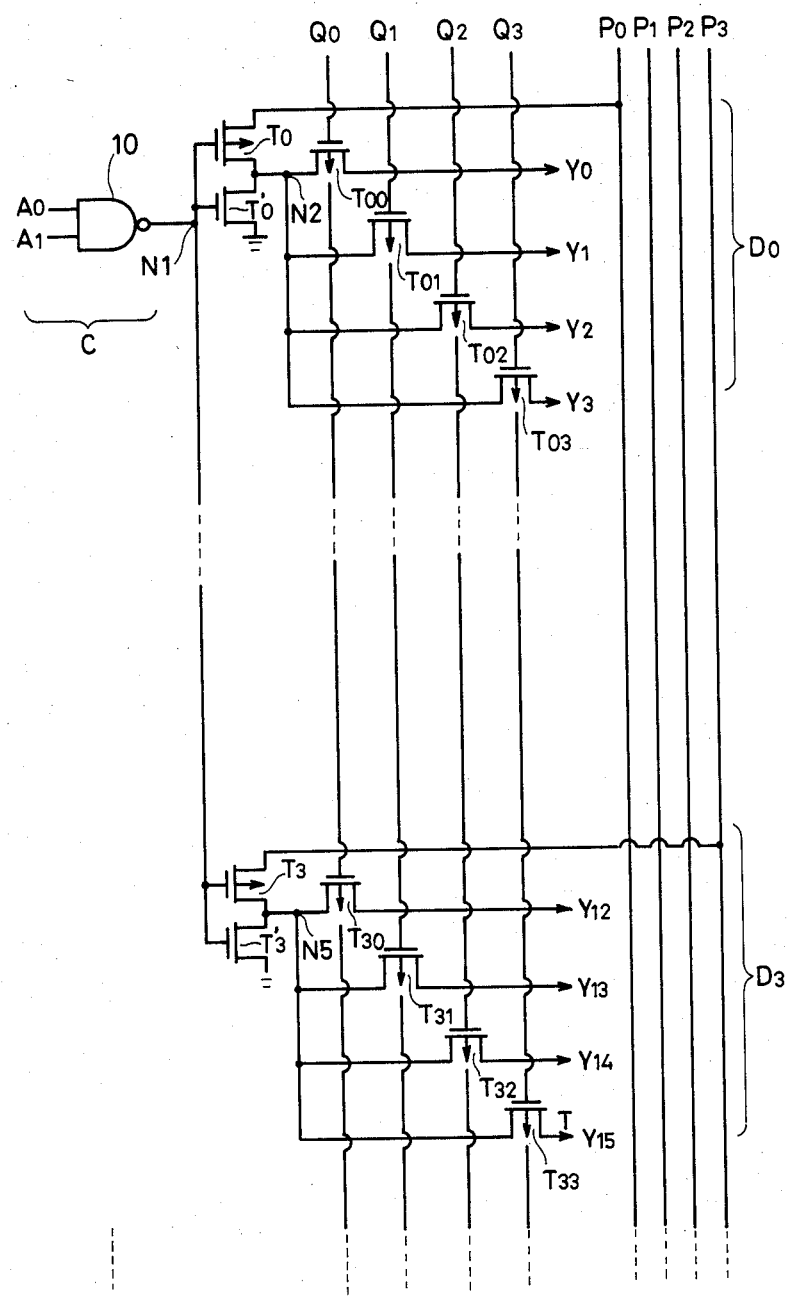
FIG. 7 illustrates a decoder circuit according to an embodiment of the present invention.

FIG. 7 illustrates a decoder circuit formed by CMOS circuits according to an embodiment of the present invention. The embodiment as shown in FIG. 7 is in the form of a 1-of-64 decoder circuit. Referring to FIG. 7, each decoder part is formed by a main decoder part C and four subdecoder parts $D_0$ to $D_3$ (subdecoder parts $D_1$ and $D_2$ are omitted in FIG. 7). A 2-input NAND circuit 10 forming the main decoder part C receives address signals $A_0$ and $A_1$. The subdecoder part $D_0$ is formed by a PMOS transistor $T_0$, an NMOS transistor $T_0'$ and PMOS transistors $T_{00}$ to $T_{03}$. The PMOS transistor $T_0$ has a drain receiving a predecoded signal $P_0$, a source connected to a node N2 and a gate connected to an output node N1 of the 2-input NAND circuit 10. The NMOS transistor $T_0'$ has a drain connected to the node N2, a grounded source and a gate connected to the node N1. The PMOS transistor $T_{00}$ has a drain connected to a node N2, a source connected to an output end deriving decoded output $Y_0$ and a gate receiving a predecoded signal $Q_0$. The PMOS transistor $T_{01}$ has a drain connected to the node N2, a source connected to an output end deriving decoded output $Y_1$ and a gate receiving a predecoded signal $Q_1$. The PMOS transistor $T_{02}$ has a drain connected to the node N2, a source connected to an output end deriving decoded output $Y_2$ and a gate receiving a predecoded signal $Q_2$. The PMOS transistor $T_{03}$ has a drain connected to the node N2, a source connected to an output end deriving decoded output $Y_3$ and a gate receiving a predecoded signal $Q_3$.

In a similar manner of connection, the subdecoder part $D_1$ (omitted in FIG. 7) is formed in correspondence to a predecoded signal $P_1$ and the subdecoder part $D_2$ (omitted in FIG. 7) is formed in correspondence to a predecoded signal $P_2$, while the subdecoder part $D_3$ is formed in correspondence to a predecoded signal $P_3$.

Figure 8:
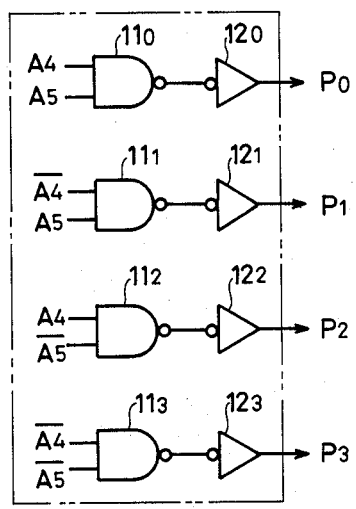
FIG. 8 illustrates a circuit for generating predecoded signals $P_0$ to $P_3$ used in the decoder circuit as shown in FIG. 7.
Figure 9:
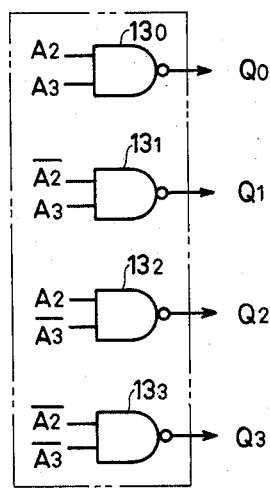
FIG. 9 illustrates a circuit for generating predecoded signals $Q_0$ to $Q_3$ used in the decoder circuit as shown in FIG. 7.

FIGS. 8 and 9 show circuits for generating the four predecoded signals $P_0$ to $P_3$ and the other four predecoded signals $Q_0$ to $Q_3$ used in the decoder circuit as shown in FIG. 7 respectively. As shown in FIG. 8, the circuit for generating the predecoded signals $P_0$ to $P_3$ is formed by 2-input NAND circuits $11_0$ to $11_3$ and inverter circuits $12_0$ to $12_3$ (i.e., logically formed by AND circuits) to generate the predecoded signals $P_0$ to $P_3$ by decoding address signals $A_4$, $\overline{A}_4$, $A_5$ and $\overline{A}_5$. On the other hand, the circuit for generating the predecoded signals $Q_0$ to $Q_3$ is formed by only 2-input NAND circuits $13_0$ to $13_3$, to generate the predecoded signals $Q_0$ to $Q_3$ by decoding address signals $A_2$, $\overline{A}_2$, $A_3$ and $\overline{A}_3$ by the 2-input NAND circuits $13_0$ to $13_3$.

Although FIG. 7 shows only one decoder part, three similar decoder parts are further provided to form the 1-of-64 decoder circuit as a whole. Needless to say, address signals inputted in the respective decoder parts are in different combinations.

Description is now made on the operation of the aforementioned embodiment. It is assumed here that all of the address signals $A_0$, $A_1$, $A_2$, $A_3$, $A_4$ and $A_5$ are at "H" levels, for the sake of convenience. The 2-input NAND circuit 10 receives the address signals $A_0$ and $A_1$, and hence the output node N1 is brought into an "L" level, whereby the NMOS transistors $T_0'$, $T_1'$, $T_2'$ and $T_3'$ ($T_1'$ and $T_2'$ are omitted in FIG. 7) are turned off and the PMOS transistors $T_0$, $T_1$, $T_2$ and $T_3$ ($T_1$ and $T_2$ are omitted in FIG. 7) are turned on. At this time, only $P_0$ of the predecoded signals $P_0$ to $P_3$ is brought into an "H" level while $P_1$ to $P_3$ are brought into "L" levels, as obvious from FIG. 8. Therefore, only the node N2 of the subdecoder part $D_0$ connected with the predecoded signal $P_0$ is brought into an "H" level, while the nodes N3, N4 and N5 (N3 and N4 are not shown in FIG. 7) of the other subdecoder parts $D_1$, $D_2$ and $D_3$ are left at "L" levels.

Then, as obvious from FIG. 9, only $Q_0$ of the predecoded signals $Q_0$ to $Q_3$ is brought into an "L" level while $Q_1$, $Q_2$ and $Q_3$ are brought into "H" levels. Therefore, only the PMOS transistor $T_{00}$ is turned on so that only the output $Y_0$ is brought into an "H" level. In other words, the other PMOS transistors $T_{01}$, $T_{02}$ and $T_{03}$ remain in OFF states, whereby all of the outputs $Y_1$, $Y_2$ and $Y_3$ are at "L" levels.

Thus, the decoder circuit as shown in FIG. 7 is adapted to first select the main decoder part by the address signals $A_0$ and $A_1$, then select one of the subdecoder parts $D_0$ to $D_3$ by the predecoded signals $P_0$ to $P_3$ and select one of the PMOS transistors $T_{00}$, $T_{01}$, $T_{02}$ and $T_{03}$ by the predecoded signals $Q_0$ to $Q_3$, thereby to function as a decoder circuit.

The feature of the present invention is further clarified by comparing the decoder circuit of FIG. 7 according to this embodiment with the aforementioned conventional decoder circuit.

Figure 1:
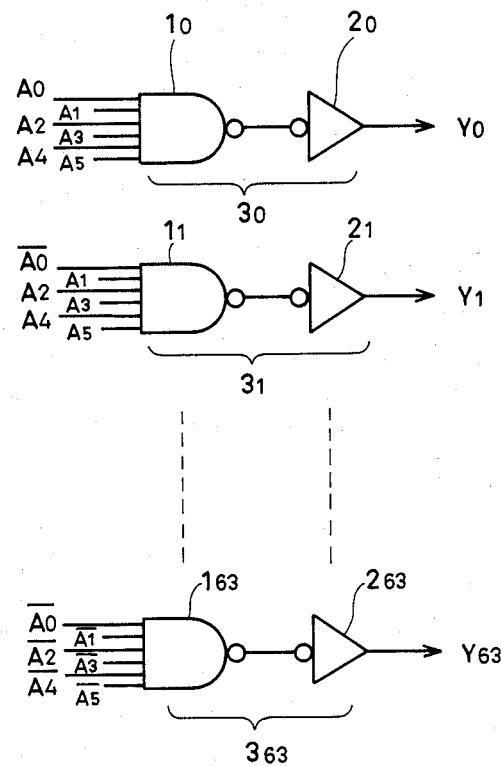
FIG. 1 is a logic circuit diagram showing an example of a conventional 1-of-64 decoder circuit.
Figure 2:
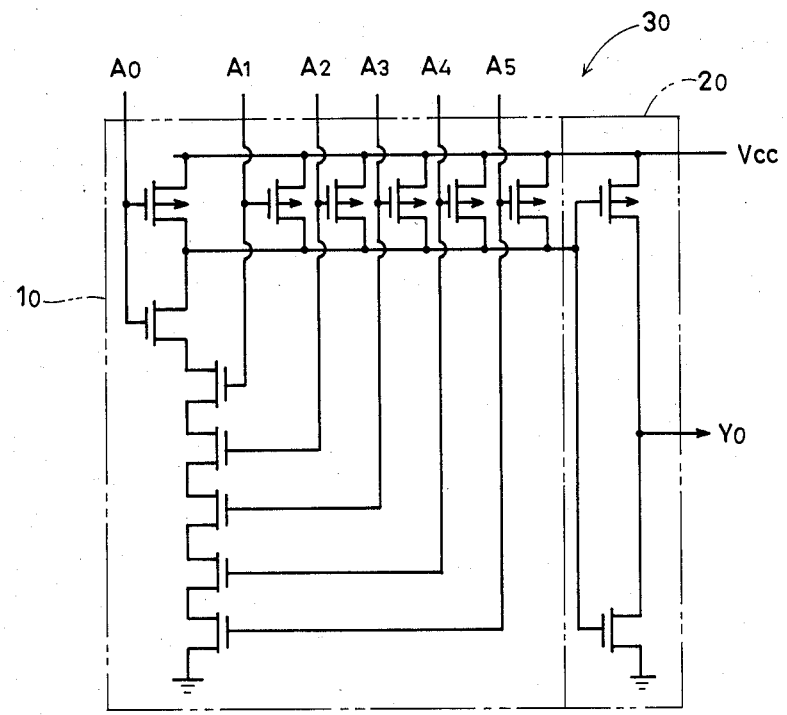
FIG. 2 is a circuit diagram showing one of decoder parts as shown in FIG. 1, which decoder part is formed by a CMOS circuit.
Figure 3:
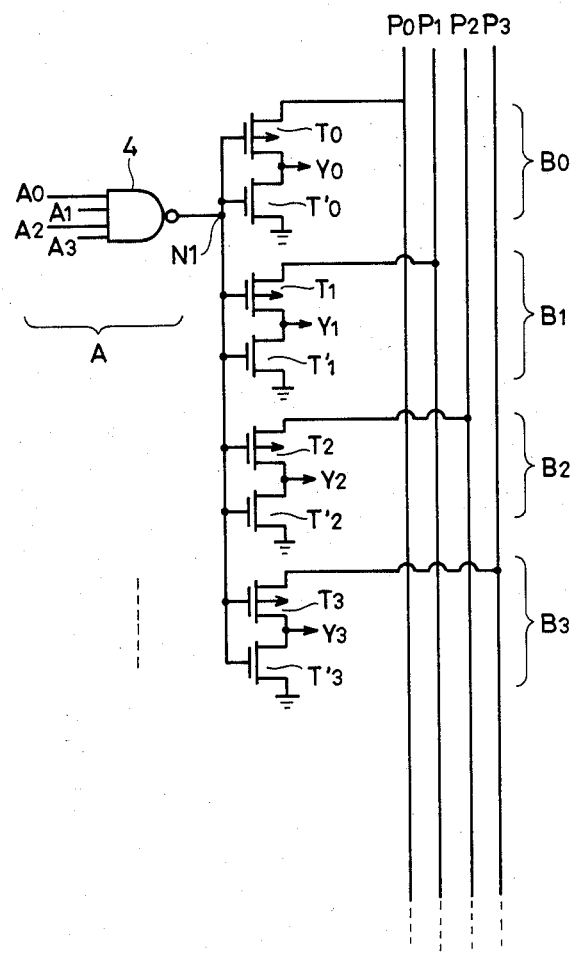
FIG. 3 illustrates another example of a conventional decoder circuit employed for enlarging the pitch of the decoder circuit formed by CMOS circuits.
Figure 4:
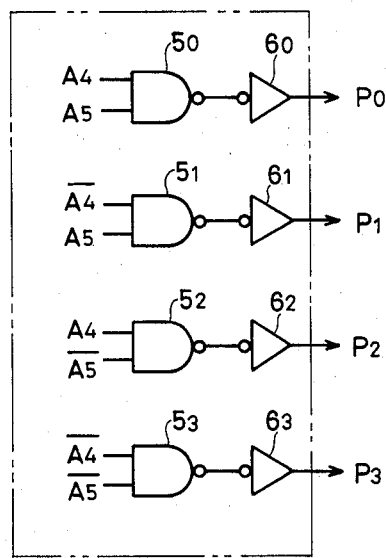
FIG. 4 illustrates a circuit for generating predecoded signals $P_0$ to $P_3$ used in the decoder circuit as shown in FIG. 3.

First, the pitch of the main decoder part C in the decoder circuit of this embodiment is 16 times longer than that of the conventional decoder circuit as shown in FIG. 1, whereby the decoder circuit of this embodiment can be subjected to pattern layout in the pitch of 64 $\mu$m (4 $\mu$m $\times$ 16) in application to a 1-Mbit MOS dynamic RAM with sufficient allowance in view of the latch-up problem.

Figure 5:
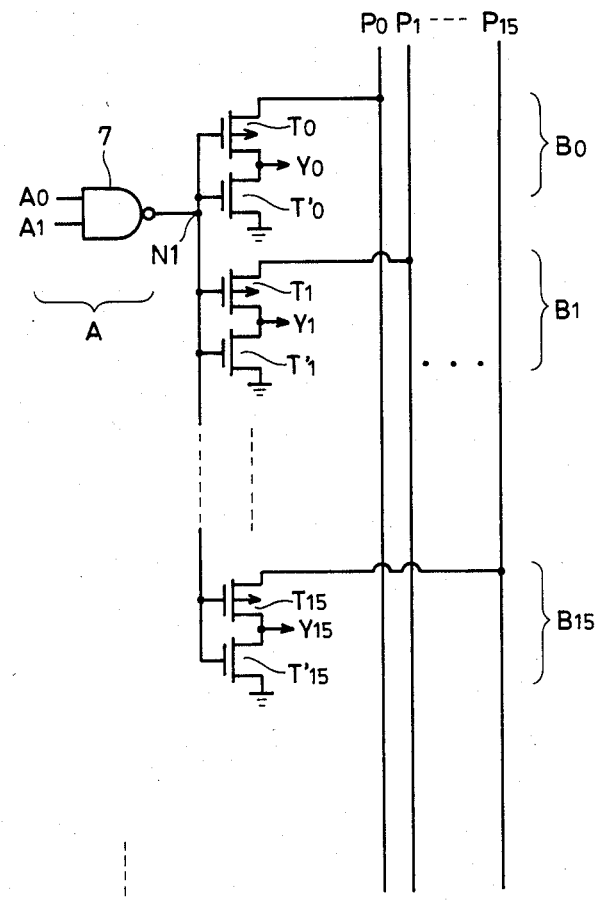
FIG. 5 illustrates still another example of a conventional decoder circuit proposed to further enlarge the pitch of the decoder circuit.
Figure 6:
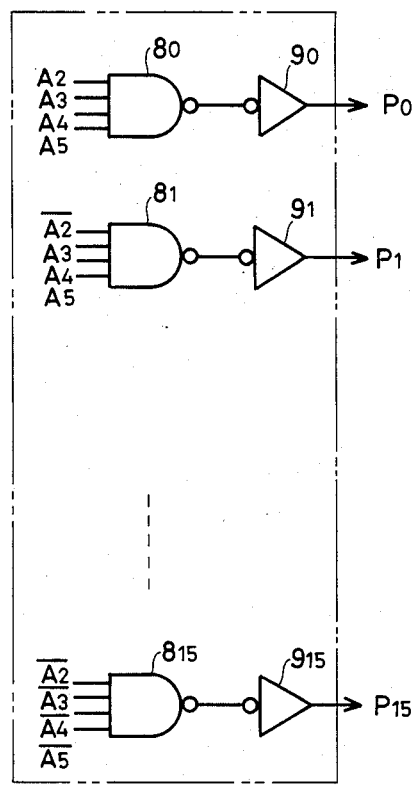
FIG. 6 illustrates a circuit for generating predecoded signals $P_0$ to $P_{15}$ used in the decoder circuit as shown in FIG. 5.

Second, the number of the predecoded signals $P_0$ to $P_3$ and $Q_0$ to $Q_3$ in the aforementioned embodiment is eight in total, which number is one half of the conventional case as shown in FIG. 5 employing 16 predecoded signals. Further, while the conventional decoder circuit as shown in FIG. 5 employs the 4-input NAND circuits $8_0$ to $8_{15}$ (see FIG. 6) for generating the predecoded signals, the aforementioned embodiment employs the 2-input NAND circuits $11_0$ to $11_3$ and $13_0$ to $13_3$. Thus, the aforementioned embodiment can perform pattern layout in a smaller area in comparison with the conventional circuit as shown in FIG. 5.

Third, the output node N1 of the main decoder part C is connected with the four PMOS transistors $T_0$ to $T_3$ and the four NMOS transistors $T_0'$ to $T_3'$, i.e., eight transistors in total in the aforementioned embodiment, and hence the stray capacitance is $\frac{1}{4}$ of that of the conventional decoder circuit as shown in FIG. 5 employing 32 transistors, to improve the operating speed of the decoder circuit.

Although the above embodiment has been described with reference to a decoder circuit formed by NAND circuits, the present invention is also applicable to a decoder circuit formed by NOR circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A decoder circuit for decoding a plurality of bits of input signals, said decoder circuit comprising:
   a plurality of decoder parts each having a main decoder part for decoding a first bit group of said input signals and a plurality of subdecoder parts connected with said main decoder part;
   first predecoding means for generating first predecoded signals by decoding a second bit group of said input signals; and
   second predecoding means for generating second predecoded signals by decoding a third bit group of said input signals,
   each said subdecoder part including:
   a CMOS circuit driven by the output from said main decoder part and selectively activated by said first predecoded signals, and
   a plurality of switching elements commonly receiving the output from said CMOS circuit and being selectively switched by said second predecoded signals.

2. A decoder circuit in accordance with claim 1, wherein
   each said main decoder part includes a NAND circuit outputting the NAND logic of said first bit group of said input signals,
   said first predecoding means includes a plurality of AND circuits outputting the AND logic of said second bit group of said input signals, and
   said second predecoding means includes a plurality of NAND circuits outputting the NAND logic of said third bit group of said input signals.

3. A decoder circuit in accordance with claim 1, wherein
   said CMOS circuit includes P-channel MOS transistors and N-channel MOS transistors serially interposed between said first predecoded signals and the ground for receiving the output from said main decoder part in respective gates thereof,
   each said switching element includes a P-channel MOS transistor having a gate receiving one of said second predecoded signals, a drain receiving the output from said CMOS circuit and a source outputting a finally decoded signal of said input signal.

* * * * *